(12) United States Patent
Chisholm et al.

(10) Patent No.: US 7,218,105 B2
(45) Date of Patent: May 15, 2007

(54) NUCLEAR QUADRUPOLE RESONANCE MEASUREMENTS

(75) Inventors: Warrick Paul Chisholm, Ferndale (AU); Peter Alaric Hayes, Wembly Downs (AU); John Harold Flexman, Kardinya (AU); Vassili Timofeevitch Mikhaltsevitch, St. James (AU); Taras Nikolaevitch Rudakov, Willetton (AU)

(73) Assignee: QRSciences Pty. Ltd., Cannington, Western Australia (AU)

( * ) Notice: Subject to any disclaimer, the term of this patent is extended or adjusted under 35 U.S.C. 154(b) by 0 days.

(21) Appl. No.: 10/518,920

(22) PCT Filed: Jun. 24, 2003

(86) PCT No.: PCT/AU03/00789

§ 371 (c)(1),
(2), (4) Date: Aug. 29, 2005

(87) PCT Pub. No.: WO04/001454

PCT Pub. Date: Dec. 31, 2003

(65) Prior Publication Data

US 2006/0038563 A1    Feb. 23, 2006

(30) Foreign Application Priority Data

Jun. 24, 2002    (AU) .................................. PS3194

(51) Int. Cl.
*G01V 3/00* (2006.01)
(52) U.S. Cl. ..................... 324/307; 324/309
(58) Field of Classification Search ............... 324/307, 324/309
See application file for complete search history.

(56) References Cited

U.S. PATENT DOCUMENTS 4,063,150 A    12/1977   Ohte et al.

(Continued)

FOREIGN PATENT DOCUMENTS

GB    2 319 086    5/1998

(Continued)

OTHER PUBLICATIONS

Suits et al., "Noise-Immune Coil for Unshielded Magnetic Resonance Measurements," Journal of Magnetic Resonance, vol. 131, 1998, pp. 154-158.

(Continued)

*Primary Examiner*—Louis M. Arana
(74) *Attorney, Agent, or Firm*—Michael Bednarek; Paul, Hastings, Janofsky & Walker LLP

(57) ABSTRACT

An apparatus for exciting and detecting NQR in a substance containing quadrupole nuclei responsive to the NQR phenomenon. The apparatus includes a coil 15 for irradiating an item that may contain a substance with RF waves to excite NQR in quadrupole nuclei within the substance and for receiving an NQR signal emitted in response thereto. A transmitter unit 10 is provided for producing and transmitting an RF pulse to the probe to create said RF waves. A receiver unit 11 is provided to receive and treat a received signal from said probe for subsequent processing and detection of a said NQR signal therein. A sensing means is included in the apparatus for sensing an extraneous parameter that may influence the detection of the NQR signal from the item to be scanned. A computer 12 is provided for processing the treated received signal to identify a said NQR signal therein, and control the transmitting means and the receiving means in response to said processing means and said sensing means to optimize the excitation and detection of the NQR signal. The sensing means may comprise one or more temperature probes 13, RF antennas 17, metal detectors 18, metal imagers 19, temperature tags 20 and optical or infrared scanners 22 and 23, or any one or combination of these.

46 Claims, 11 Drawing Sheets

U.S. PATENT DOCUMENTS

| | | | |
|---|---|---|---|
| 5,047,783 A | 9/1991 | Hugenin | |
| 5,109,853 A | 5/1992 | Taicher et al. | |
| 5,168,224 A | 12/1992 | Maruizumi et al. | |
| 5,227,800 A | 7/1993 | Huguenin et al. | |
| 5,365,171 A | 11/1994 | Buess et al. | |
| 5,583,437 A | 12/1996 | Smith et al. | |
| 5,592,083 A | 1/1997 | Magnuson et al. | |
| 5,594,338 A | 1/1997 | Magnuson | |
| 5,786,696 A | 7/1998 | Weaver et al. | |
| 5,790,685 A | 8/1998 | Sallee | |
| 5,986,455 A | 11/1999 | Magnuson | |
| 6,054,856 A | 4/2000 | Garroway et al. | |
| 6,088,423 A * | 7/2000 | Krug et al. | 378/57 |
| 6,091,240 A | 7/2000 | Smith et al. | |
| 6,194,898 B1 | 2/2001 | Magnuson et al. | |
| 6,222,364 B1 | 4/2001 | Smith et al. | |
| 6,246,237 B1 * | 6/2001 | Smith et al. | 324/307 |
| 6,268,724 B1 | 7/2001 | Crowley | |
| 6,342,835 B1 | 1/2002 | Nelson-White | |
| 6,359,582 B1 | 3/2002 | MacAleese et al. | |
| 6,392,408 B1 | 5/2002 | Barrall et al. | |
| 6,577,128 B1 | 6/2003 | Smith et al. | |
| 6,856,133 B1 * | 2/2005 | Beliakov et al. | 324/307 |
| 6,900,633 B2 * | 5/2005 | Sauer et al. | 324/307 |
| 7,023,956 B2 * | 4/2006 | Heaton et al. | 378/57 |

FOREIGN PATENT DOCUMENTS

| | | |
|---|---|---|
| WO | WO 92/21989 | 12/1992 |
| WO | WO 96/26453 | 8/1996 |
| WO | WO 99/45408 | 9/1999 |

OTHER PUBLICATIONS

Flexman et al., "The Detection of Explosives in Airport Luggage Using the Direct Nuclear Quadrupole Resonance Method," Detection of Bulk Explosives Advanced Techniques Against Terrorism, Proceedings of the NATO Advanced Research Workshop, held in St. Petersburg, Russia, Jun. 16-21, 2003, Series: NATO Science Series II: Mathematics, Physics and Chemistry, Schubert, Kuznetsov (Eds.) 2004, pp. 113-124.

Hirschfeld, "Short Range Remote NQR Measurements," Journal of Molecular Structure, vol. 58, 1980, pp. 63-77.

Buess et al., "Explosives Detection by $^{14}$N Pure NQR," Advances in Analysis and Detection of Explosives, 1993, pp. 361-368.

Garroway et al., "Explosives Detection by Nuclear Quadrupole Resonance (NQR)," SPIE vol. 2276, 1994, pp. 139-149.

Garroway et al., "Narcotics and Explosives Detection by $^{14}$N Pure NQR," SPIE vol. 2092, 1993, pp. 318-327.

Landers et al., "Electronic Effects and Molecular Motion in B-Octahydro-1,3,5,7-Tetranitro-1,3,5,7-Tetrazocine Based on $^{14}$N Nuclear Quadrupole Resonance Spectroscopy," Journal of Physical and Chemistry, vol. 85, 1981, pp. 2618-2623.

Karpowicz et al., "Liberational Motion of Hexahydro-1,3,5-Trinitro-S-Triazine Based on the Temperature Dependence of the Nitrogen-14 Nuclear Quadrupole Resonance Spectra: The Relationship to Condensed-Phase Thermal Decomposition," Journal of Physical Chemistry, vol. 87, 1983, pp. 2109-2112.

Anferov et al., "A Nuclear Quadrupole Resonance Thermometer with Frequency Locking," Journal of Molecular Structure, vol. 83, 1982, pp. 365-368.

* cited by examiner

NUCLEAR QUADRUPOLE RESONANCE MEASUREMENTS

FIELD OF THE INVENTION

This invention relates to improvements in the measurement of nuclear quadrupole resonance (NQR), which has particular, although not exclusive, utility in the detection of explosives and narcotics located within mail, airport luggage and other packages using NQR. More specifically the invention relates to overcoming one or more extrinsic problems associated with the capacity to excite and/or detect NQR in a substance containing quadrupole nuclei.

Throughout the specification, unless the context requires otherwise, the word "comprise" or variations such as "comprises" or "comprising", will be understood to imply the inclusion of a stated integer or group of integers but not the exclusion of any other integer or group of integers.

BACKGROUND ART

The following discussion of the background art is intended to facilitate an understanding of the present invention only. It should be appreciated that the discussion is not an acknowledgement or admission that any of the material referred to is or was part of the common general knowledge as at the priority date of the application.

NQR has been proposed as an alternative technology for the detection of explosives, narcotics and other illicit substances containing quadrupole nuclei responsive to the NQR phenomenon. Whilst NQR detection technology in theory may be used to detect explosives in items at airports, mail centres and entry points to important buildings such as courthouses etc, in practice, great difficulty has been encountered in designing and producing an NQR scanner that is practicable and reliable to operate in such environments.

An NQR scanner device theoretically brings an item to be scanned, such as luggage, to stop within a coil or near a coil or coils. The computer in control of the device directs the transmitter to irradiate the item being scanned with a burst of radiofrequency (RF) waves, which excite an NQR substance within the item being scanned. After a short period of dead time the receiver detects any very small voltage induced on the coil by relaxing quadrupolar nuclei. The computer then receives and transforms this signal and determines whether this signal exceeds a predetermined threshold level. If the signal does exceed the threshold level an alarm is signalled to the operator.

It has been found, however, that the entire process is dependent upon the physical characteristics of the item being scanned and the surrounding environment. Certain characteristics of the scan item affect the detection capability and the false alarm rate.

One of the major problems that has so far restricted the use of NQR technology is the fact that the NQR frequencies of different NQR substances drift with temperature. The amount of drift is not large (427 Hz/° C. for the 5.2 MHz line of RDX), but is enough to cause problems in measuring small hard to find signals as would be required in a practical NQR scanner. The main problem is that if the temperature of the item is unknown, then the resonant frequency of the NQR substance will also be unknown. Consequently, the item may be irradiated at the incorrect frequency resulting in a missed detection.

To overcome this problem the range of frequencies irradiated can be enlarged by using a lower transmit Q factor, however this would still result in a possible missed detection because a high receive Q factor is usually required to detect such small NQR signals.

An alternative method is to selectively irradiate small sections of the frequency spectrum sequentially so the probability of detection increases. By using this method a range of frequencies corresponding to a range of temperatures can be irradiated maximising the probability of detection. For instance, in an airport scenario for detecting an explosive having NQR nuclei, it may be expected that the range of temperatures encountered may be 0–40° C. Hence by arranging the system to irradiate all frequencies that correspond to that temperature range, the explosive should be detected.

One of the problems with the above method is the fact that it requires the use of sequential pulse sequences, each of which consume valuable time. During airport scanning of baggage, the time allowed for scanning a bag approximately ranges from 6–20 seconds. By scanning to cover a range of temperature of say 10–35° C., as many as 3 or 4 pulse sequences have to be applied so that the explosive is properly irradiated. This method results in an unacceptably long delay, which is unacceptable to the machine operator and passengers alike.

Furthermore, when irradiating the bag with two separate pulse sequences, there is a strong possibility that the explosive will be partially excited on the first sequence, resulting in a weak signal which is not detected, and then partially excited again on the second sequence, which is also not detected, resulting in a missed detection.

Another possibility is to interleave the pulse sequences such that each successive pulse group has one of the 3 or 4 frequencies required. However, the time taken to achieve the same signal sensitivity is still 3 or 4 times longer as compared to a single pulse sequence.

In the process of scanning objects and relying upon RF frequencies for signal detection, NQR scanners invariably encounter the problem of RF interference. The RF interference can be external or internal to the machine. One form of internal interference can emanate from the item being scanned. Items such as mobile phones, toys, video cameras, watches etc all emit RF noise resulting in difficulty in the detection of weak NQR RF signals. Pulse sequences that have been used to overcome magnetoacoustic ringing, may partially counteract this problem, however these techniques cannot fully remove this phenomenon.

A further problem is that the detection of illicit substances containing NQR nuclei encased within metal objects using conventional NQR techniques is difficult. The RF waves generated by an NQR scanner device are generally unable to penetrate metal surfaces due to the eddy current effect. This means that in scanning airport luggage for explosives, it may be possible to pass an explosive in a bag through an NQR scanner and it not be detected by the scanner. This problem makes current NQR scanners deficient in their capability, and is one of the principal reasons as to why no commercially viable NQR scanners have appeared in the market.

DISCLOSURE OF THE INVENTION

It is an object of the present invention to improve the excitation and detection capability of NQR within items containing quadrupole nuclei responsive to the NQR phenomenon, and which may be scanned for such.

In accordance with a first aspect of the present invention there is provided an apparatus for exciting and detecting NQR in a substance containing quadrupole nuclei responsive to the NQR phenomenon, comprising:

a probe for irradiating an item that may contain a substance with RF waves to excite NQR in quadrupole nuclei within the substance and for receiving an NQR signal emitted in response thereto;

a transmitting means for producing and transmitting an RF pulse to the probe to create said RF waves;

a receiving means to receive and treat a received signal from said probe for subsequent processing and detection of a said NQR signal therein;

sensing means for sensing an extraneous parameter that may influence the detection of the NQR signal from the item to be scanned; and a computer for processing the treated received signal to identify a said NQR signal therein and to control the transmitting means and the receiving means in response to said processing means and said sensing means to optimise the excitation and detection of the NQR signal.

It is an object of a preferred aspect of the invention to provide for the improvement in the excitation and detection of NQR by having regard to the temperature effect problem as described in relation to the background art.

This preferred object may be achieved by using one or more temperature probes as the sensing means for measuring the temperature. These probes either sense the ambient temperature or the scan item temperature and are used to determine at which frequency the sample should be irradiated.

Preferably, said control means is adapted to direct the transmitting means and the probe to irradiate the item at a range of NQR frequencies that lie close to the NQR frequency of the substance containing quadrupole nuclei to be detected, as adjusted in accordance with the temperature measured by said temperature probe.

Preferably, the measured temperature is the ambient room temperature.

Preferably, the measured temperature is the external building temperature.

Preferably, the measured temperature is the external temperature of the item to be scanned.

Preferably, the temperature measured is the internal temperature of the item to be scanned.

Preferably, the measured temperature is some combination of the ambient room temperature, the external building temperature, the external item temperature or the internal item temperature.

Preferably, a thermal image of the item is used to determine its temperature and detect excessively hot or cold scan items.

Preferably, the temperature measured originates from a probe tag attached to the item.

Preferably, the apparatus includes an RF probe to monitor any RF emissions from the item to be scanned prior to it being scanned.

Preferably, the apparatus includes sensors to determine the height and length of a scanned item prior to it being scanned.

It is an object of another preferred aspect of the present invention to provide for the improvement in the detection of NQR by overcoming or at least mitigating the problem of interference.

This preferred object may be achieved by using an RF probe as the sensing means to monitor RF emissions from the item to be scanned before it is actually scanned. This RF probe is used to sense if the RF emissions exceed a prescribed threshold and if so, indicate that the scan item is not appropriate for NQR detection.

It is preferred that the RF device is able to detect RF emissions from a sample and send signals representative thereof to the processing means, said processing means being able to monitor the signals and determine if the RF emissions from an item containing a sample exceed a prescribed threshold level, and said control means providing an alarm signal indicating that the item is not appropriate for NQR detection in response to said processing means determining that the RF emissions exceed said prescribed threshold level.

It is an object of another preferred aspect of this invention to provide for the improvement in the detection of NQR by the detection of metal objects contained within items to be scanned.

This preferred object may be achieved by using an RF antenna as the sensing means that may be excited with pulses of RF energy and to irradiate an item to be scanned. Preferably, the RF antenna can allow a return signal to be measured and transformed into frequency space after a period of dead time to indicate whether there is a significant amount of metal present.

Accordingly, it is preferred that the control means be adapted to excite the antenna with pulses of RF energy that is able to irradiate a sample and receive return signals after a period of dead time, the NQR device having processing means to measure and transform the return signals into frequency space, and if the signal detected at the transmit frequency exceeds a predetermined threshold, signal the presence of a significant amount of metal.

In accordance with a further aspect of the invention, there is provided a method for exciting and detecting NQR in a substance containing quadrupole nuclei responsive to the NQR phenomenon.

BRIEF DESCRIPTION OF THE DRAWINGS

The invention will be better understood in the light of the following description of several specific embodiments thereof. The description is made with reference to the accompanying drawings, wherein.

BEST MODE(S) FOR CARRYING OUT THE INVENTION

The best mode for carrying out the invention will now be described with reference to an apparatus for scanning and detecting illicit substances using the NQR phenomenon, comprising an NQR scanner device and various sensing means, the main components of various embodiments of the apparatus being shown in block diagram form in FIGS. 1 and 2 of the drawings.

Figure 1:
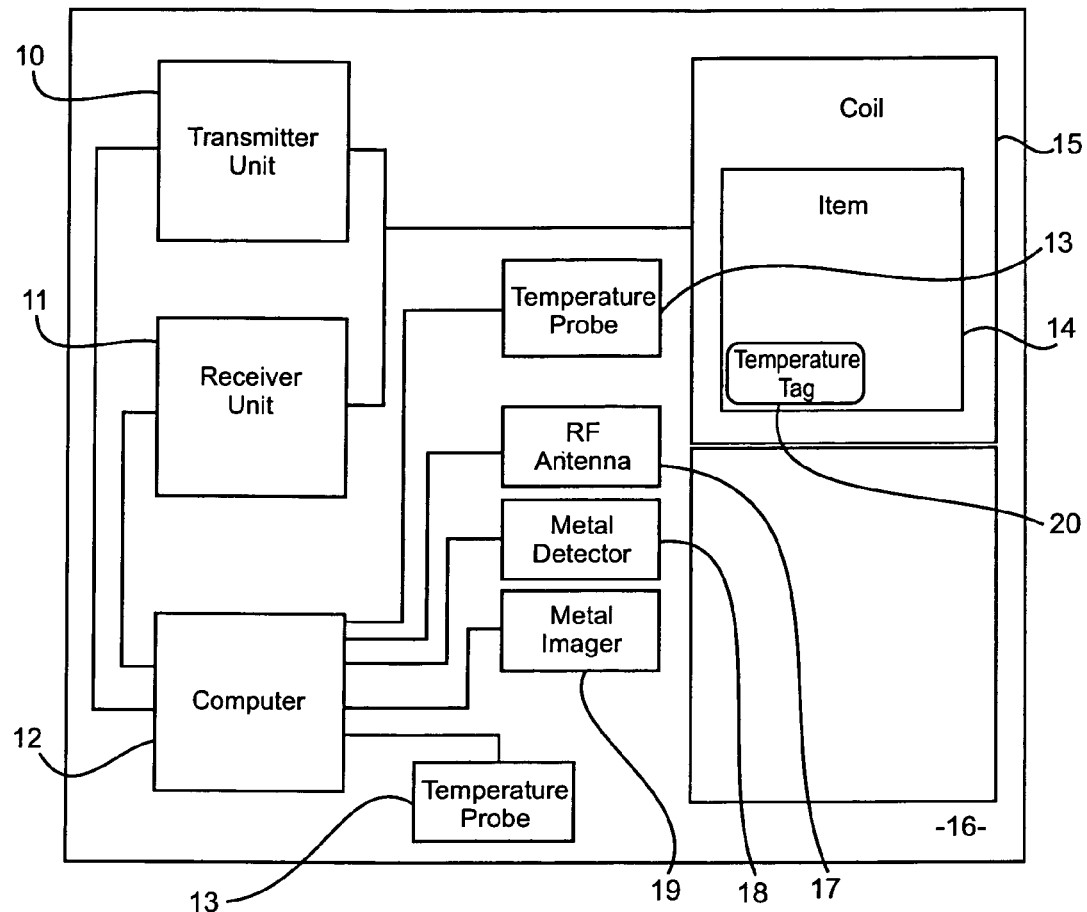
FIG. 1: shows a block diagram of an NQR scanner device in accordance with the various embodiments.
Figure 2:
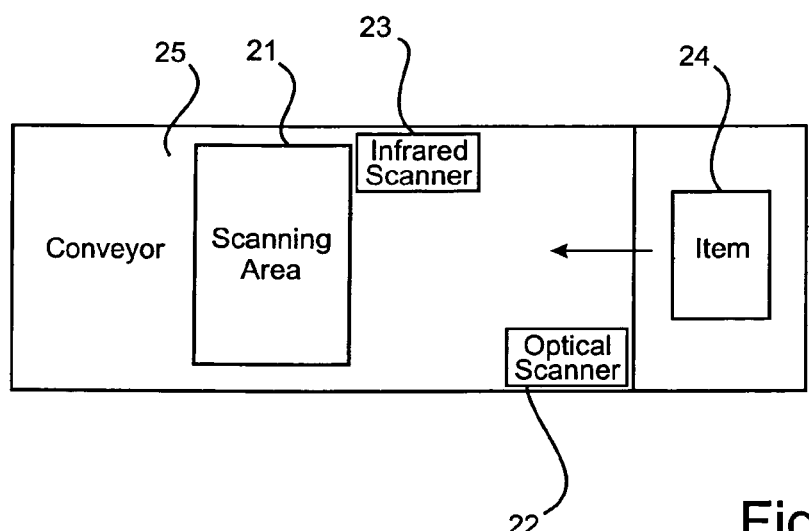
FIG. 2: is a schematic plan view of the NQR scanner device of FIG. 1, showing the relative location of optical or infrared scanners in accordance with the seventh embodiment.

Referring to FIGS. 1 and 2, the sensing means comprises one or more temperature probes 13, RF antennas 17, metal detectors 18, metal imagers 19, temperature tags 20 and optical or infrared scanners 22 and 23, or any one or combination of these, electrically attached either directly or wirelessly to an NQR scanner device 16 that generally comprises a transmitter unit 10, a receiver unit 11, a computer 12 and a coil 15. The NQR device 16 scans airport luggage, postal items etc. searching for illicit substances.

As previously mentioned, one of the problems associated with using the prior art method of scanning a nuclear quadrupole substance with multiple pulse sequences at differing transmit frequencies to cover a large temperature range is that this causes a large time delay.

This process can be performed more efficiently by adopting the apparatus of the best mode with one or more temperature probes for sensing the ambient temperature and irradiating the item to be scanned with a range of frequencies close to the NQR frequency of the substance containing quadrupole nuclei to be detected. This frequency is adjusted according to the ambient temperature that is sensed by the temperature probes. Thus one of the features of the best mode for carrying out the invention is that the NQR scanner device 16 only need be designed to transmit one pulse sequence at one frequency for detecting a particular substance and thus save valuable time, leading to an increased throughput of items that may be scanned for the detection of illicit substances.

The first specific embodiment of the invention is directed towards an apparatus including the NQR scanner device 16, and a temperature probe or probes 13 for sensing the ambient room temperature prior to scanning an item 14 of interest, and then scanning the item with the NQR device, compensating for the temperature of the item containing the substance to be detected.

The range of frequencies at which the NQR device 16 scans the item 14 are selected to lie close to the frequency which mathematically corresponds to the temperature or temperatures measured by the probe or probes 13. If multiple probes 13 are used then some mathematical combination is used to calculate the best temperature, such as the average. The computer 12 in the present embodiment is designed to take the temperature measured by the probe or probes 13 and compute the corresponding frequency via a look up table or direct calculation. For instance, the RDX 5.2 MHz NQR line drifts approximately at a rate of 427.4 Hz/° C. close to room temperature. Hence after measuring the temperature the computer operates in accordance with a prescribed algorithm to input the resultant number into the following equation:

$$\text{Frequency} = 0.4274 \times \text{Temperature} + 5202; \quad (1)$$

where: Temperature is in °C. and the Frequency is in kHz.

Equation 1 produces a frequency at which to scan the item. The computer 12 is then programmed to direct the transmitter 10 to send pulses to the coil 15 which irradiates the item 14 at a range of frequencies close to this value.

Pulses at these frequencies are transmitted by the transmitter unit 10 to the coil 15 to excite the NQR substance, if present, within the item, the quadrupole nuclei creating a small RF magnetic field which induces a small voltage on the coil 15 that is measured by the receiver unit 11 and sent to the computer 12, resulting in a detection. This detection is accomplished at a much faster rate as compared to the prior art method of irradiating the substances with 3 or 4 pulse sequences at different frequencies to cover a large temperature range.

In a variation of the first embodiment, a marginally different method of converting the measured temperature into a frequency is used. In this arrangement, the algorithm followed by the computer 12 involves calculating the difference of the measured temperature from a known fixed temperature and applying a corresponding frequency differential to adjust the scanning frequency of the scanner.

Moreover, this method involves taking the measured temperature, subtracting it from a fixed reference temperature, and converting this difference into a frequency differential. This frequency differential can then be added to the known fixed frequency corresponding to the reference temperature to determine a new frequency, and the sample pulsed over a range of frequencies near to this new frequency. The net result is identical to that achieved by adopting the method previously described in the present embodiment.

In accordance with a second specific embodiment, the sensing means comprises one or more RF antennas 17 attached to the NQR scanner 16. In one arrangement of the present embodiment, these antennas are narrow single turn coils of the same external dimension as the opening through which items are passed into the NQR scanner for scanning purposes, and which are resonant at the NQR frequencies. These antennas do not transmit any signal but are arranged to only receive signals. The antennas are operated by the apparatus to monitor the RF emissions emanating from the item 14 to be scanned.

Figure 3:
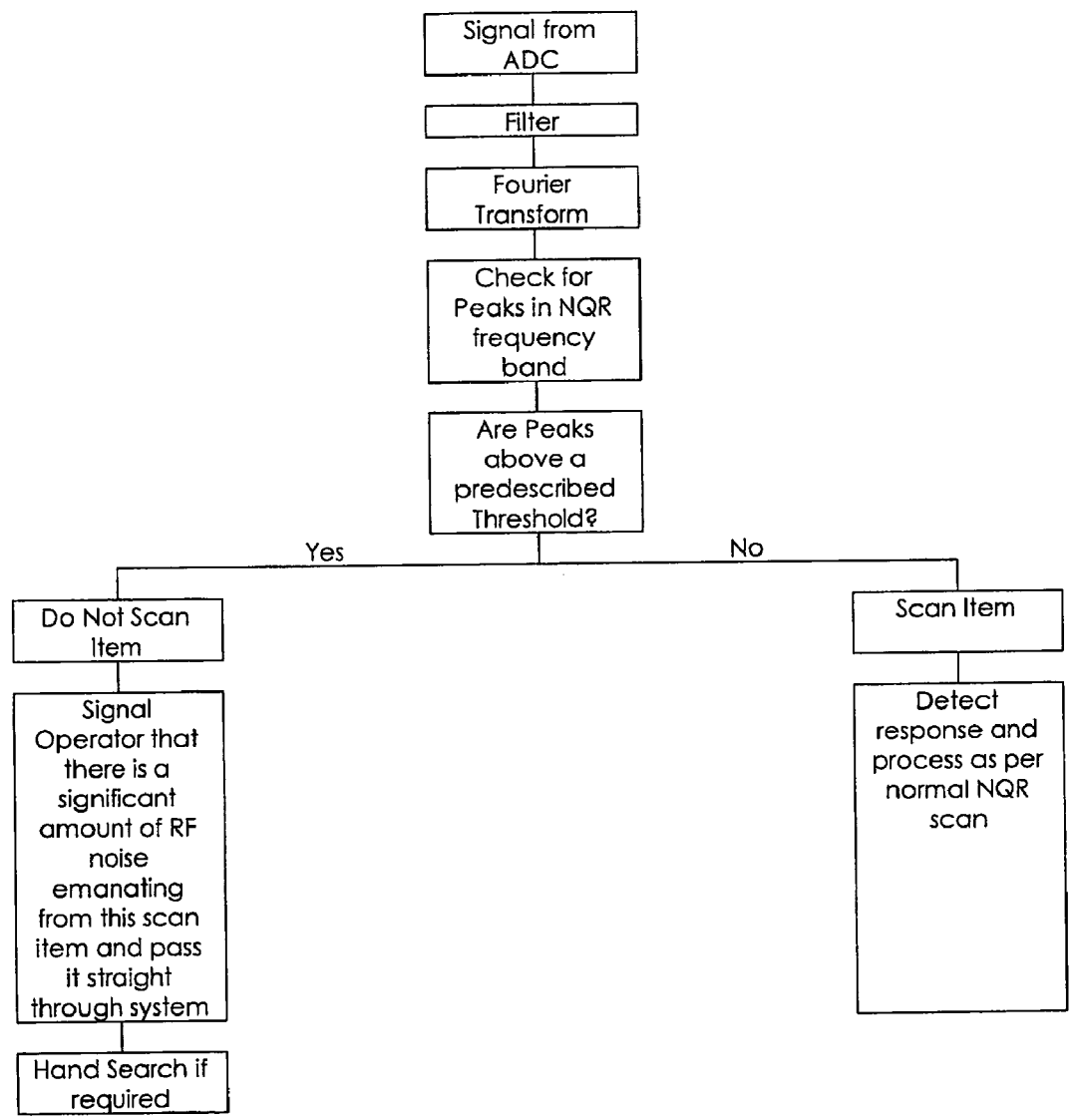
FIG. 3 is a flowchart of the decision making process for detection of RF noise emanating from the scan item in accordance with the second embodiment.

After being received on the single turn coil(s) the signals are amplified and sent to the computer 12 via an analogue to digital converter (ADC). On the computer 12 the signals are filtered and then Fourier transformed to determine if there are any significant frequency peaks lying near to the NQR frequency of interest. If significant frequency peaks are found to exist above a prescribed threshold value, then the computer produces a signal indicating that the item is not suitable for NQR detection. Accordingly, the apparatus is controlled to not scan the item and pass it straight through the NQR scanner 16 for alternative action, such as hand searching. Alternatively, if no significant frequency peaks are found, then the computer 12 permits the item to be moved into the scan volume of the NQR scanner 16 and be scanned. The decision making process programmed into the computer 12 to provide for the detection of RF transmissions is shown in FIG. 3.

In accordance with a third specific embodiment, the apparatus comprises sensing means specifically in the form of one or more RF antennas belonging to a metal detector 18, which is also attached to the NQR scanner 16 so that these antennas are excited with pulses of RF energy which irradiate the scan item 14. In one arrangement, these antennae are single turn coils having substantially the same dimensions as the main coil 15 within the NQR scanner 16.

The irradiation of a metallic object with RF energy induces eddy currents within the object, and this is used in the present embodiment to determine if any such objects are present.

Figure 4:
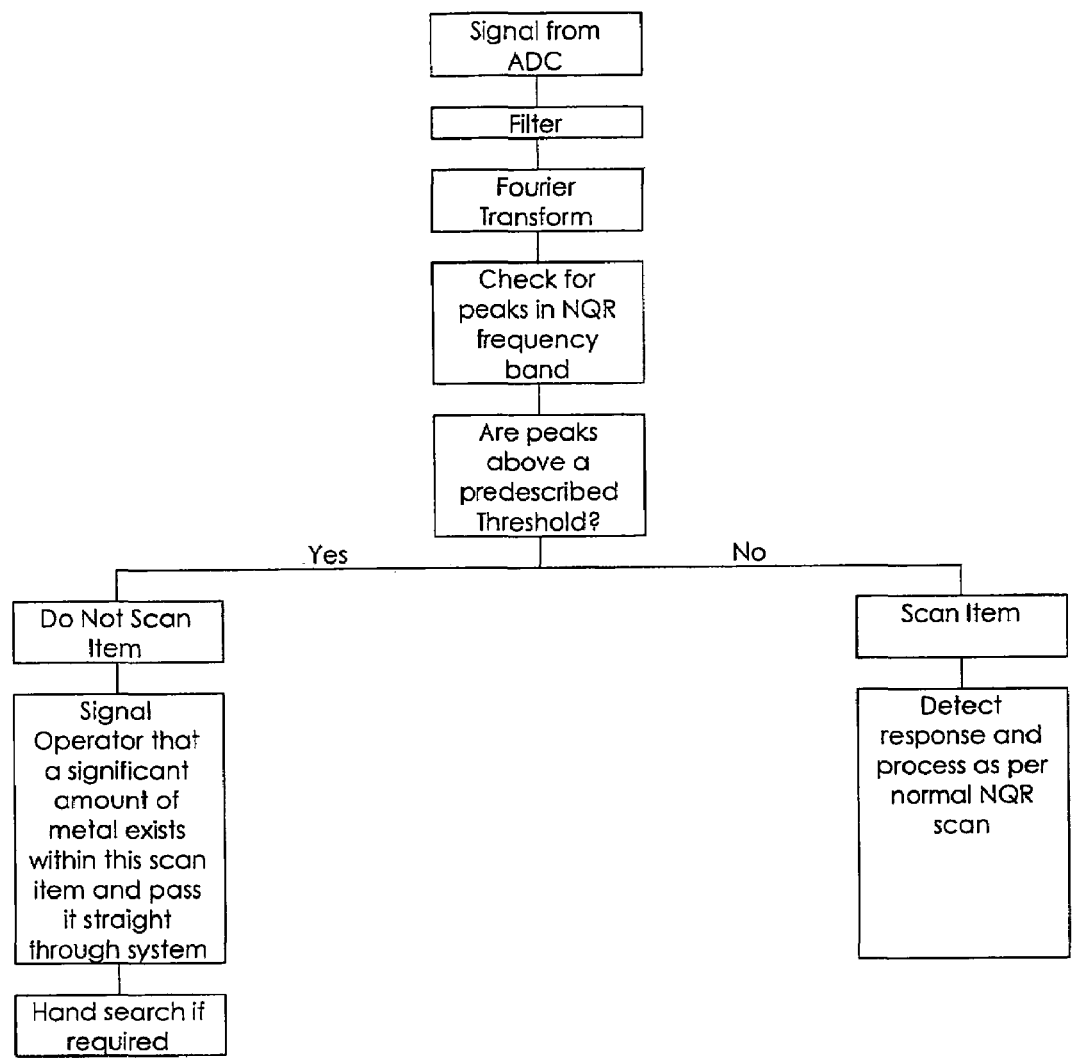
FIG. 4: is a flowchart of the decision making process for the pulse induction detection of metal objects within a scan item, in accordance with the third embodiment.

Moreover, in the present embodiment, after a suitable period of dead time to allow for ring down of the coil, eddy currents induced within any metal objects contained within an item, induce a signal upon the RF antennas. This signal is amplified and converted into a digital signal via an ADC. This digital signal is then fed to the computer 12 where it is filtered and Fourier transformed into frequency space. If significant peaks exist above a prescribed threshold level and close to the transmission frequency in the frequency spectrum, then the scan item 14 is flagged as having significant amounts of metal. The computer then signals an alarm or visual display indicating the presence of a significant amount of metal to the operator, which may indicate the presence of an object that is shielded by metal. FIG. 4 shows a flow chart of the decision making process programmed into the computer to provide for metal shielding detection.

In an alternative arrangement of the metal detector 18 described in the present embodiment, an induction balance system of metal detection is adopted, whereby two or more RF antennas of the metal detector 18 are attached to the NQR scanner 16 so that at least one of these antennas or coils are continuously excited with RF energy to irradiate the scan item 14. It is necessary to use two or more coils to keep these coils in induction balance. That is, at least one coil transmits a signal and the remaining coils receive this signal but null it out either by suitable arrangement of the coils, or by applying a counteracting nulling signal to the receiving coils.

Figure 5:
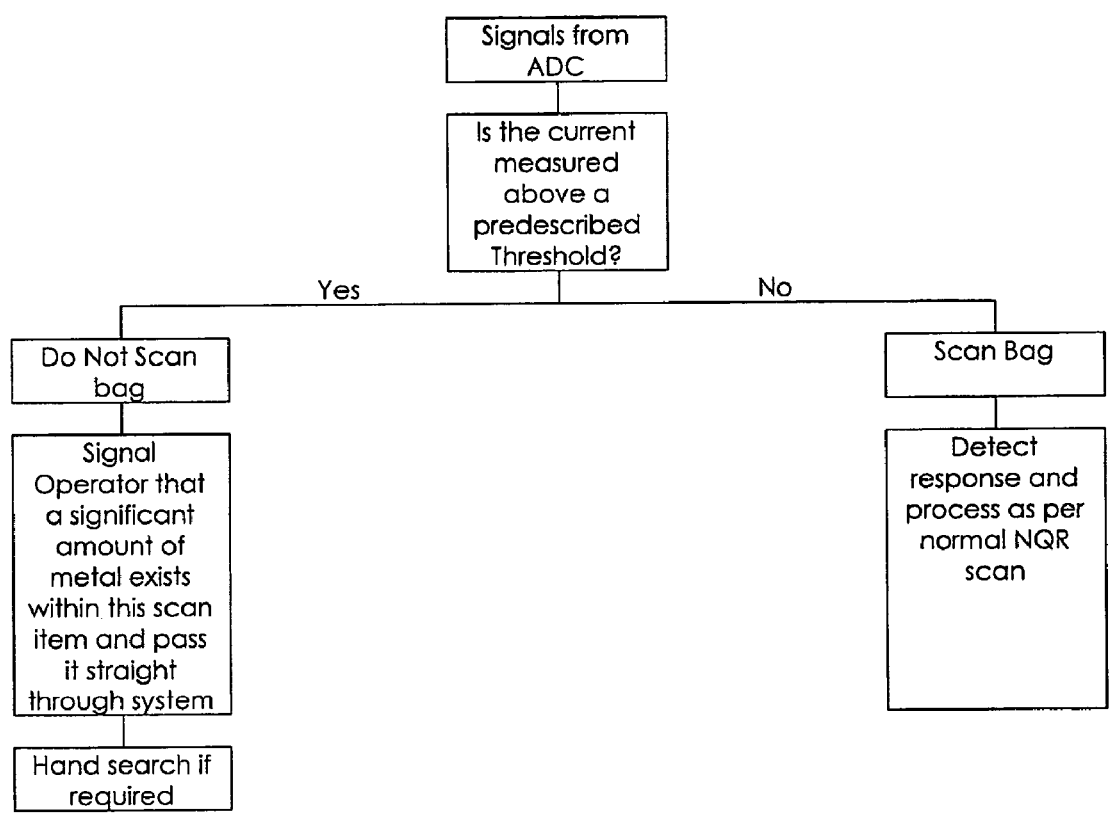
FIG. 5: is a flowchart of the decision making process for the alternative embodiment of the induction balance detection of metal objects within a scan item, also in accordance with the third embodiment.

The present arrangement makes use of the phenomenon that the introduction of metal objects near to the coil disturbs the induction balance and results in a change in current required to maintain induction balance or simply a current is drawn through the receiving coil or coils. The apparatus provides for this current to be converted into a digital signal via an ADC and then be sent to the computer 12. If this current lies above a prescribed threshold level, then the scan item 14 is flagged by the computer as having significant amounts of metal. The computer then signals an alarm or visual display to indicate the presence of a significant amount of metal to the operator, which may indicate the presence of an object shielded by metal. The decision making process programmed into the computer to provide for metal shielding detection according to the induction balance method is shown in FIG. 5.

In accordance with a fourth specific embodiment, the apparatus includes sensing means comprising one or more metal imagers 19 attached to the NQR scanner 16. These metal imagers are capable of creating an image of any metal objects within the scan item 14.

In the present embodiment, multiple coils are used to create an image of metallic items within the scan item. These multiple coils are arranged in a linear 1D, planar 2D or box shaped 3D array. In the 3D array, the coils are placed onto the sides of a hollow rectangular box such that the scan item can be passed through the box and thus be imaged in 3D by the array. Each coil of the array is subjected to a transmit pulse which excites metal objects within the scan item and induces eddy currents.

Figure 6:
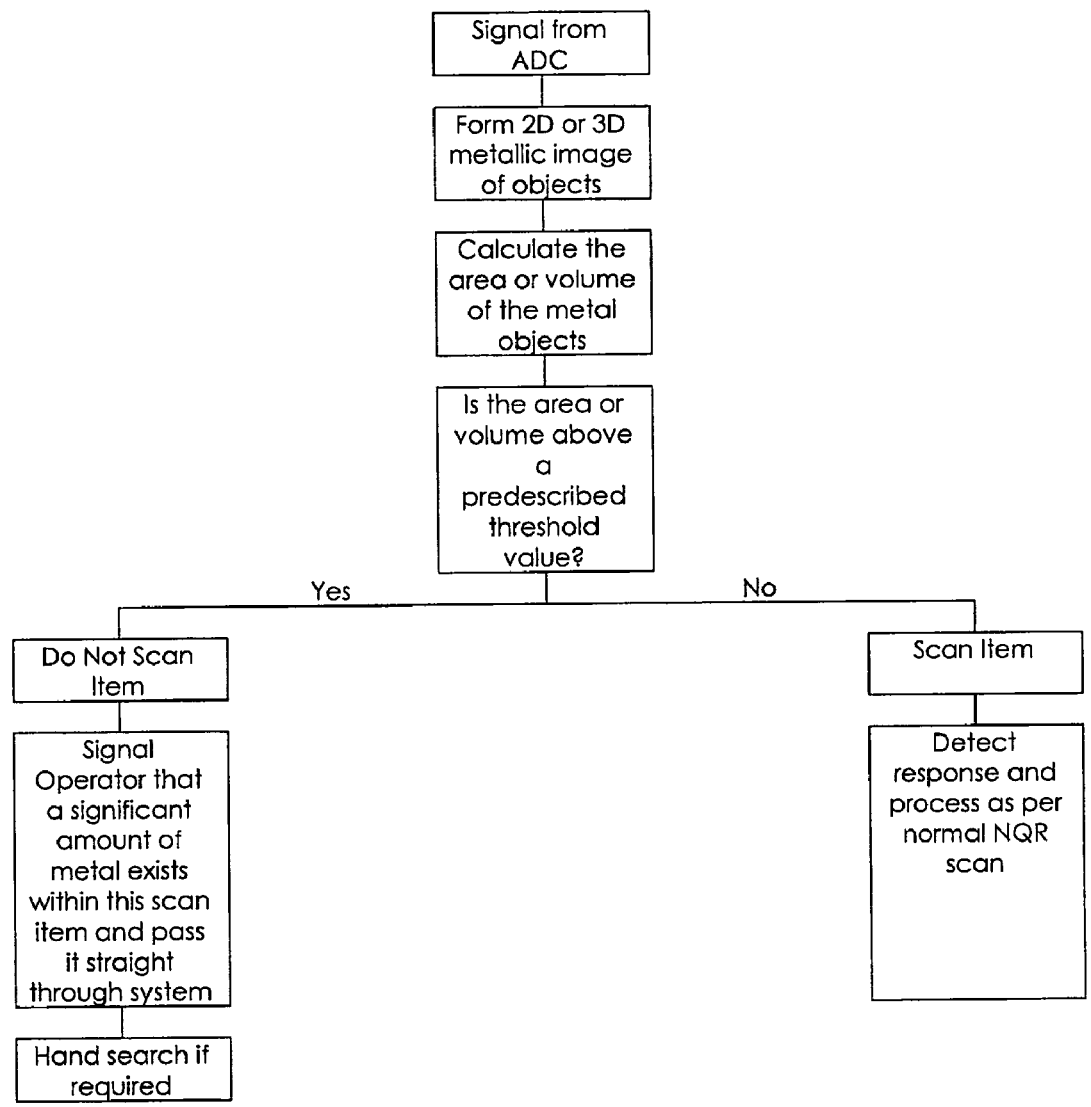
FIG. 6: is a flowchart of the decision making process for the the pulse induction metal imaging of metal objects within a scan item, in accordance with the fourth embodiment.

After a period of dead time, to allow for the coil ringing to subside, the eddy currents within the metal objects induce signals on the coil array. These signals are amplified and individually sent to an ADC included within the apparatus, where they are converted into digital signals. These signals are sent to the computer where they are Fourier transformed into frequency space. The resulting frequency signals for each coil are represented by the size of the frequency peak and these peak intensities are combined by the computer to form a 2D or 3D metal image of the object. By appropriately scaling any image formed to real physical dimensions, it is possible to calculate what area or volume metal objects within the image occupy. If the area or volume occupied by a metal object exceeds a threshold value then the item is flagged by the computer as being possibly suspicious and sent for alternative processing, such as to be hand searched or resolved by an X-ray scanner. The decision making process of the computer is shown in FIG. 6.

In an alternative arrangement of the metal imagers 19 in the present embodiment, multiple receiving coils are used and are configured in an induction balance system. These multiple coils are arranged in a linear 1D, planar 2D or box shaped 3D array as before, whereby in the 3D array, the coils are placed onto the sides of a hollow rectangular box such that the scan item can be passed through the box and thus be imaged in 3D by the array. However in this arrangement, at least one coil is used to excite the system and the other coils are used to form the image. These other coils are in induction balance and do not receive the transmitted signal, either because they are suitably arranged, or a counteracting current is applied to the receiving coils to keep them in a null state.

In the present arrangement, the transmitting coil of the array is subjected to a continuous RF signal. If a metal object comes close to the metal array the induction balance is broken and currents will flow through the receiving array of coils. These currents are converted individually into a digital signal via an ADC and sent to the computer. The computer takes these individual currents and combines them to form a 2D or 3D metal image of the object.

Figure 7:
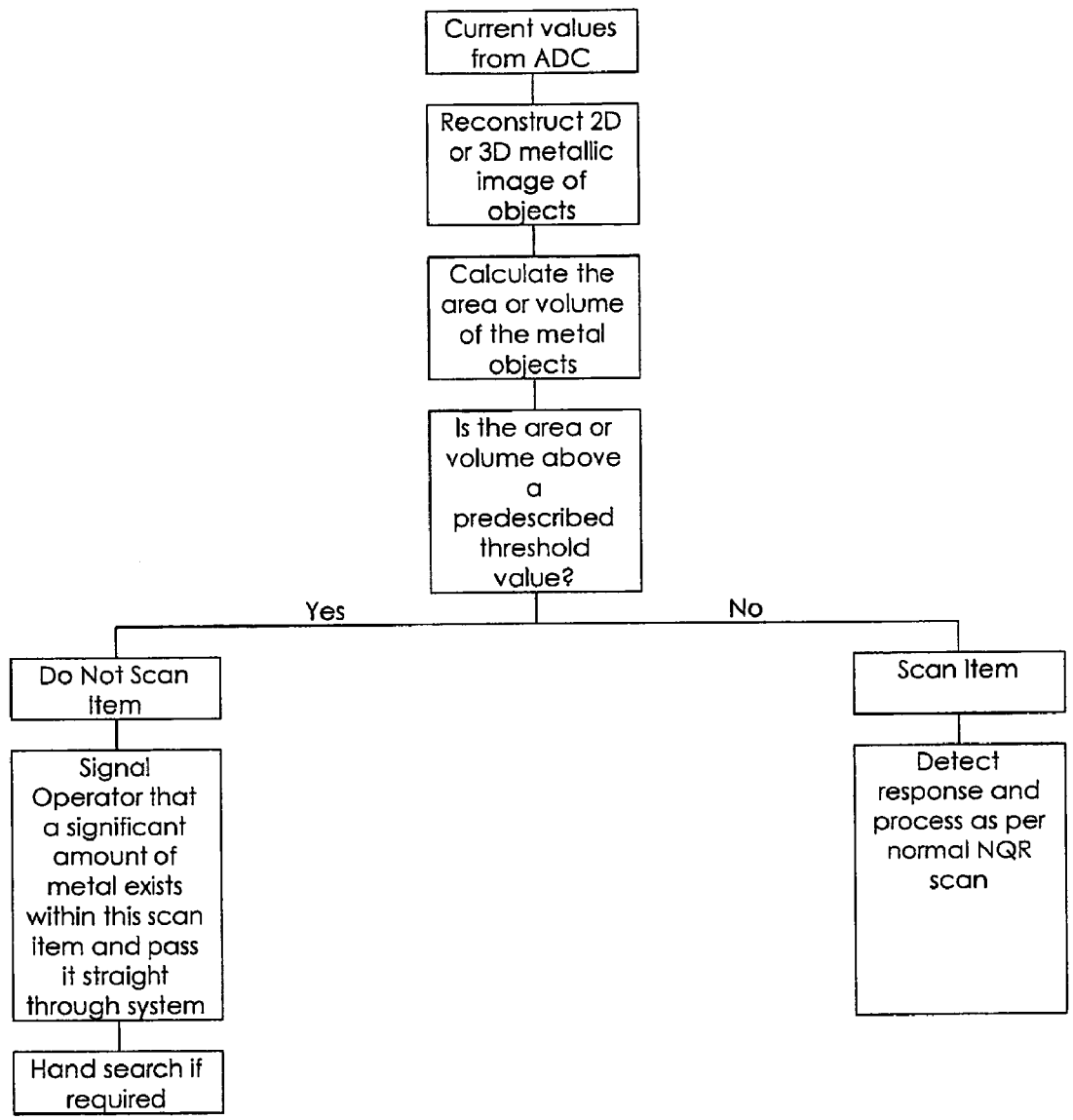
FIG. 7: is a flowchart of the decision process for induction balance metal detection of metal objects within a scan item in accordance with a variation of the fourth embodiment.

By appropriately scaling any image formed to real physical dimensions of the scan item 14, it is possible to calculate what area or volume the image occupies. As before, if the area or volume occupied by a metal object exceeds a threshold value, then the scan item 14 is flagged by the computer as being possibly suspicious and sent for alternative processing such as to be hand searched or resolved by an X-ray scanner. The decision making process followed by the computer is shown in FIG. 7.

The metal imagers 19 in the present embodiment are designed to generate metallic images by using long wavelength RF (1–100 khz). In an alternative embodiment, a similar array of 1D, 2D or 3D coils is used to image metallic objects, but which operate in the microwave frequency region (high MHz–GHz).

The advantage of using microwaves is that the resolving power is much greater than the long wavelengths used in standard metal detectors, due to the much shorter wavelengths. Microwaves are also able to penetrate through waveguide like objects, whereas longer wavelength RF signals cannot. This makes microwaves able to distinguish loops of metal from solid, fully enclosed pieces of metal.

In a further alternative of the present embodiment, a vertical and/or horizontal 1D array of coils is used to image metallic objects inside items such as bags. As the bag moves along a conveyor belt to the NQR scanner 16 through the 1D arrays of coils, a 2D or 3D image of the object can be built up by taking measurements periodically over time as the bag moves through the 1D arrays, thus creating a 2D or 3D image of metal objects within the bag. This technique also allows the overall dimensions of the NQR scanner to be smaller than if a 2D or 3D array was required to image the metallic objects within the bag. This is advantageous in airports where space is at a premium.

Figure 10:
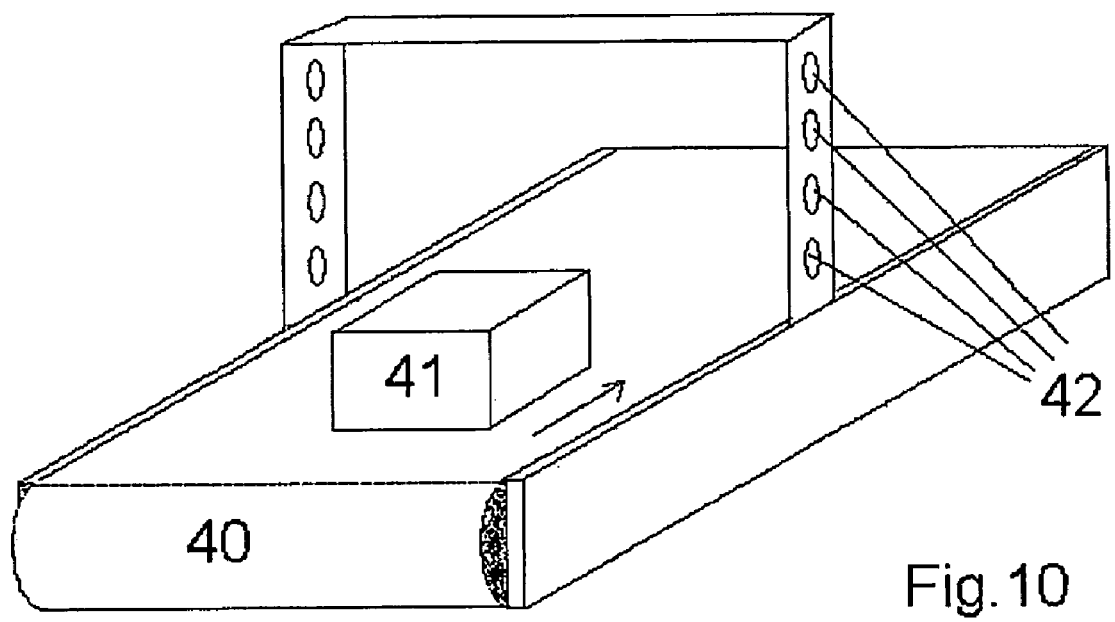
FIG. 10: is a diagram showing the detection of shielded objects by a metal detecting 1D coil array, in accordance with another alternative of the fourth embodiment.

FIG. 10 shows a scan item 41 moving along a conveyor belt 40 into a 1D array of metal detecting coils 42 which are configured to sense the presence of metallic objects either through pulse induction or induction balance techniques, as described. The signals from the 1D arrays are sent to an analogue to digital converter (not shown).and then to the computer where the image is constructed as the scan item moves through the array of 1D array of coils.

According to a fifth embodiment, the apparatus is interconnected with an X-ray machine for the purposes of locating metal objects. In this embodiment, the X-ray machine can be a standard AT type X-ray, a Multi View Tomography (MVT) type X-ray or a Computer Tomography (CT) type X-ray machine. It is well known that X-ray machines are able to detect metal objects such as guns and knives. Hence, it is possible to use 2D or 3D X-ray images to identify metal objects, which could be potentially shielding explosives within scan items from NQR detection.

In the present embodiment, an NQR explosive detection scanner is placed next to an X-ray machine, where the X-ray machine is used to generate X-ray images of an item passed through the machine, transfer these images to the NQR detection scanner, and the computer of the NQR scanner is operated to analyse the image for potential metal shielded objects. If any shielded objects are found the operator of the NQR scanner is notified, otherwise the item, such as a bag, passes through the machine unimpeded. In the present embodiment, the X-ray image is also used to confirm the exact location of a metal object, after the computer has flagged the item as possibly containing a shielded object.

Figure 8:
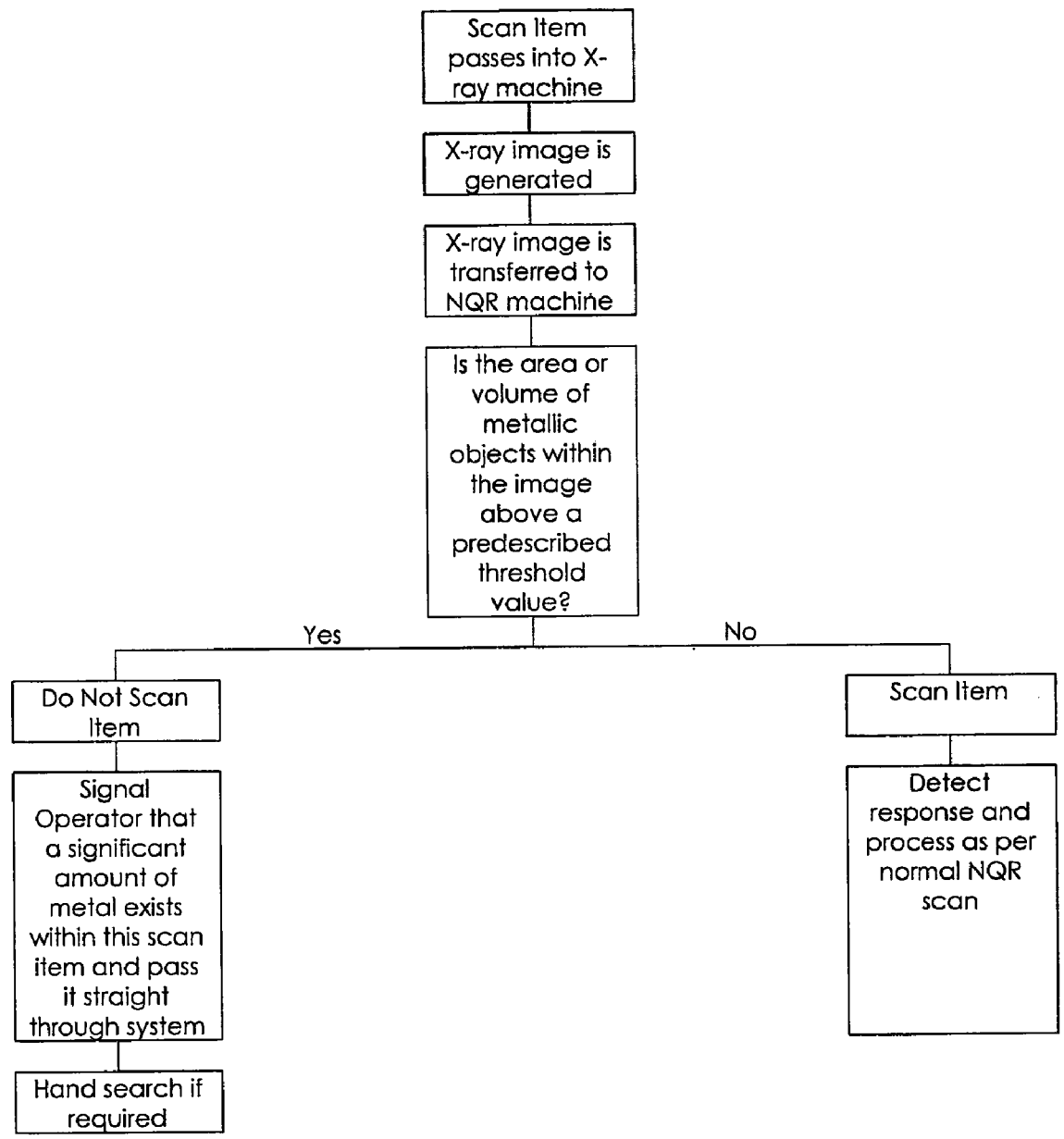
FIG. 8 is a flow chart showing the decision making process for the X-ray detection of shielded objects in accordance with a fifth embodiment.

The decision making process followed by the apparatus in the present embodiment is shown in FIG. 8.

In alternative arrangement of the present embodiment, X-ray and microwave imaging is used in conjunction with each other to detect metal objects.

Figure 9:
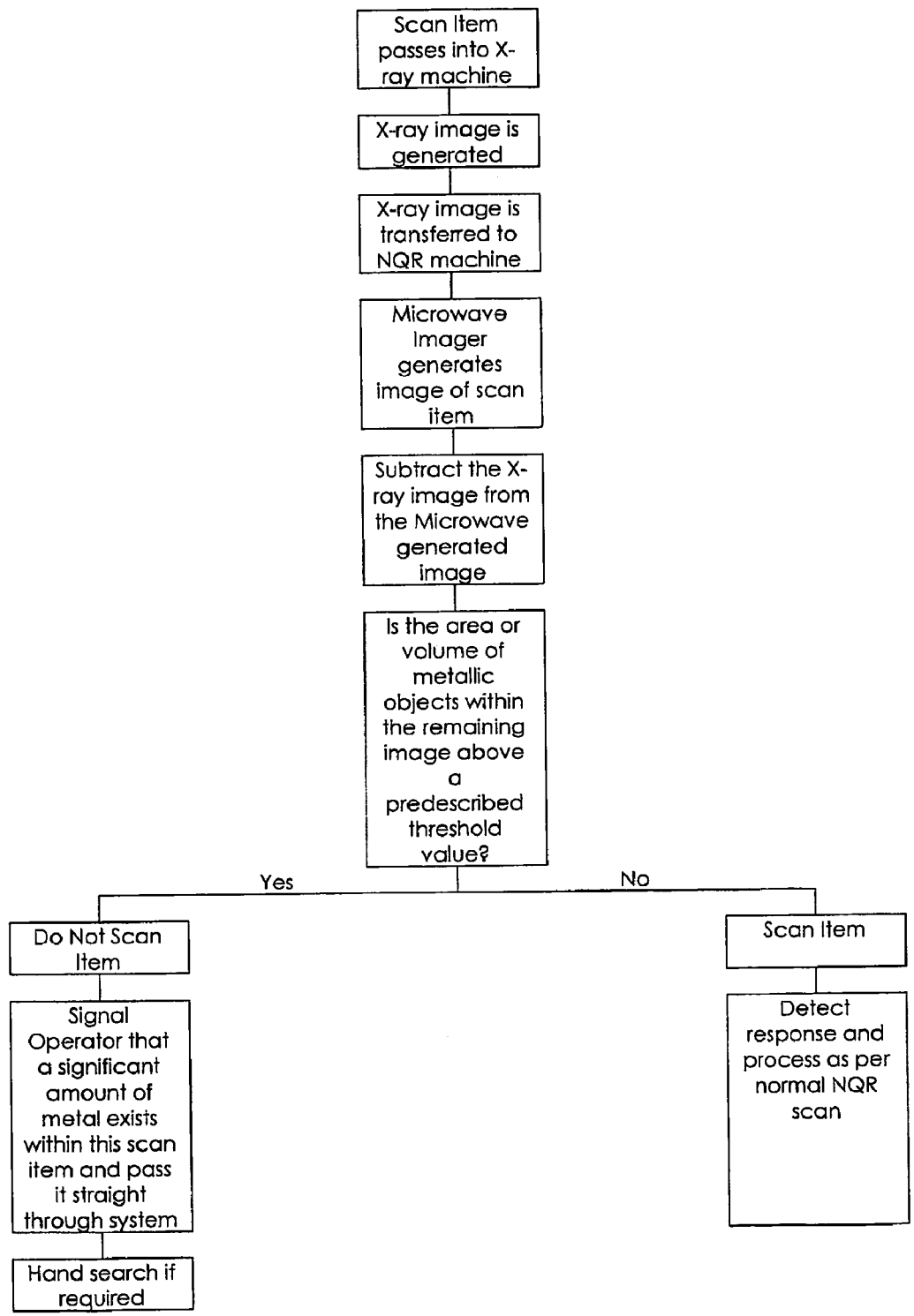
FIG. 9: is a flow chart showing the decision making process for the detection of aluminium shields by microwave and X-ray imaging, in accordance with an alternative arrangement of the fifth embodiment.

One of the main drawbacks of using the X-ray derived imaging to identify metallic shields is the inability of X-ray to successfully image aluminium foil. This is due to the small interaction between X-rays and the aluminium foil, unlike other metal targets. To help distinguish genuine aluminium metallic foil shields from other metallic objects found in scanned items, the present arrangement involves subtracting the X-ray image of the item derived from the X-ray machine, from the 2D microwave image, to observe any aluminium foil type metallic shields that exist within the scan item. The microwave imager images all metallic objects whereas the X-ray machine images all metallic objects except aluminium foil. Thus the difference between the two images will be objects formed or shielded by aluminium foil. The decision making process performed by the apparatus in this arrangement is shown in FIG. 9.

In accordance with a sixth embodiment, the apparatus uses a further alternative for detecting metal objects involving use of the NQR scanner device itself for this purpose. Using the NQR scanner device negates the need for adding extra units to the apparatus, which tends to increase the overall length of the apparatus. Limiting the length of the apparatus is important in space-constrained environments such as airports.

The NQR scanning device of the present embodiment has within it a tuned circuit comprising a coil and a bank of capacitors. The introduction of metal objects into the scan volume causes the tuned circuit to change its resonant frequency because the metal object lowers the inductance of the system. By adding capacitance, the circuit is then made to resonate at the correct resonant frequency.

It has been discovered, pursuant to this invention, that if the resonant frequency and system Q are monitored as an item to be scanned is moved into the coil, then frequency and the Q profile can produce information about the shielded objects contained with the item.

Figure 11A:
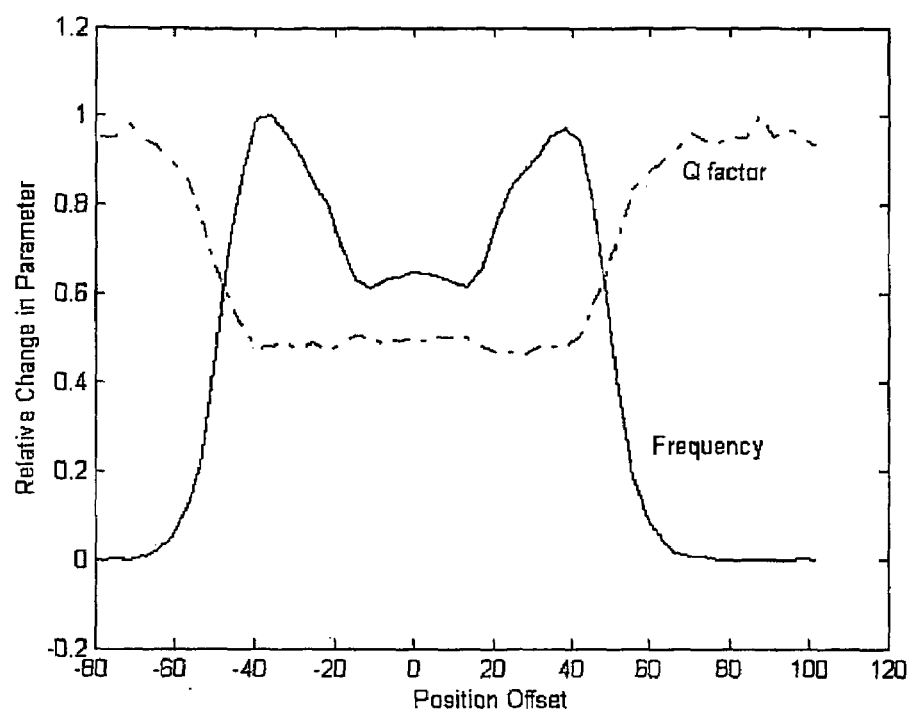
FIG. 11a is a graph showing the relative effect of an item containing metal on the Q and frequency as the item is moved into the NQR scanning device.

FIG. 11a shows the relative effect on Q and the frequency as an item is moved into the NQR scanning device. The item used in this example is a suitcase having a reinforced metallic loop around the inside of thereof. The frequency increases indicating that there has been a decrease in inductance and the Q factor has moved down indicating again a decrease in inductance.

As can be seen in FIG. 11a, one of the main drawbacks of this method, however, is that most suitcase are reinforced with a metallic bag loop which runs right around the suitcase. Because of its size it causes the frequency and Q profiles to appear like there is a large metallic shielded object contained within the suitcase. However, obviously this is not the case. To overcome this problem it has been found that the bag loops have typical frequency and Q profiles that can be readily identified and removed by curve fitting the profiles and subtracting out these profiles. What remains after this subtraction process gives an indication of whether there are shielded objects remaining in the suitcase.

Accordingly, the computer of the NQR scanning device of the present embodiment is suitably programmed to be provided with appropriate suitcase curve fitting profiles and processing software to subtract out these profiles from scanned profile. The resultant objects are then correlated against an X-ray image thereof to determine if a possible shielded object exists.

In one arrangement, this correlation is done manually by the operator or in another arrangement it is done automatically by image recognition software capable of performing the correlation and recognizing possible shielded objects against other benign metallic objects such as keys, coins, scissors etc.

Figure 11B:
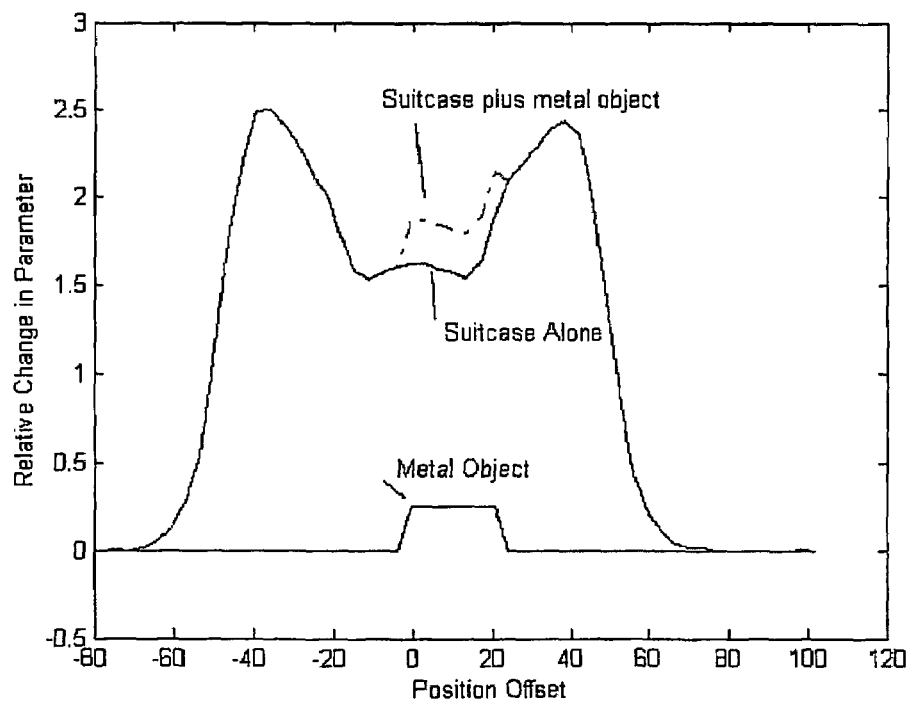
FIG. 11b is another graph showing the use of subtraction in accordance with the sixth embodiment.

FIG. 11b shows the subtraction process. The bag loop signature in FIG. 11a has been altered by placing a metal object within the suitcase and rescanning the object. This results in the dashed line, which denotes a summation of the suitcase signature and the metal object. Subtraction of the suitcase's signature reveals the presence of the metal object, which then is confirmed against an X-ray image.

In an alternative arrangement of the present embodiment for detecting metallic shields, the operating frequency of the NQR scanning device or metal detector is changed to specifically try to detect aluminium shields.

As previously mentioned, nearly all metal objects can be identified in an X-ray image because of their strong X-ray absorption characteristics. However aluminium and in particular aluminium foil is an exception to this rule in that it generally cannot be imaged by an X-ray device because of the poor X-ray absorption characteristics. Hence there is a need for finding an alternative method of detecting aluminium shields.

In NQR scanning schemes, it has been found pursuant to the current invention that significant amounts of aluminium foil severely affect the Q of the NQR apparatus over other types of metal. Hence large shifts in Q, coupled with the frequency scan as an item (such as a bag) to be scanned is moved into the coil, enable the possible identification of aluminium foil objects.

Figure 12:
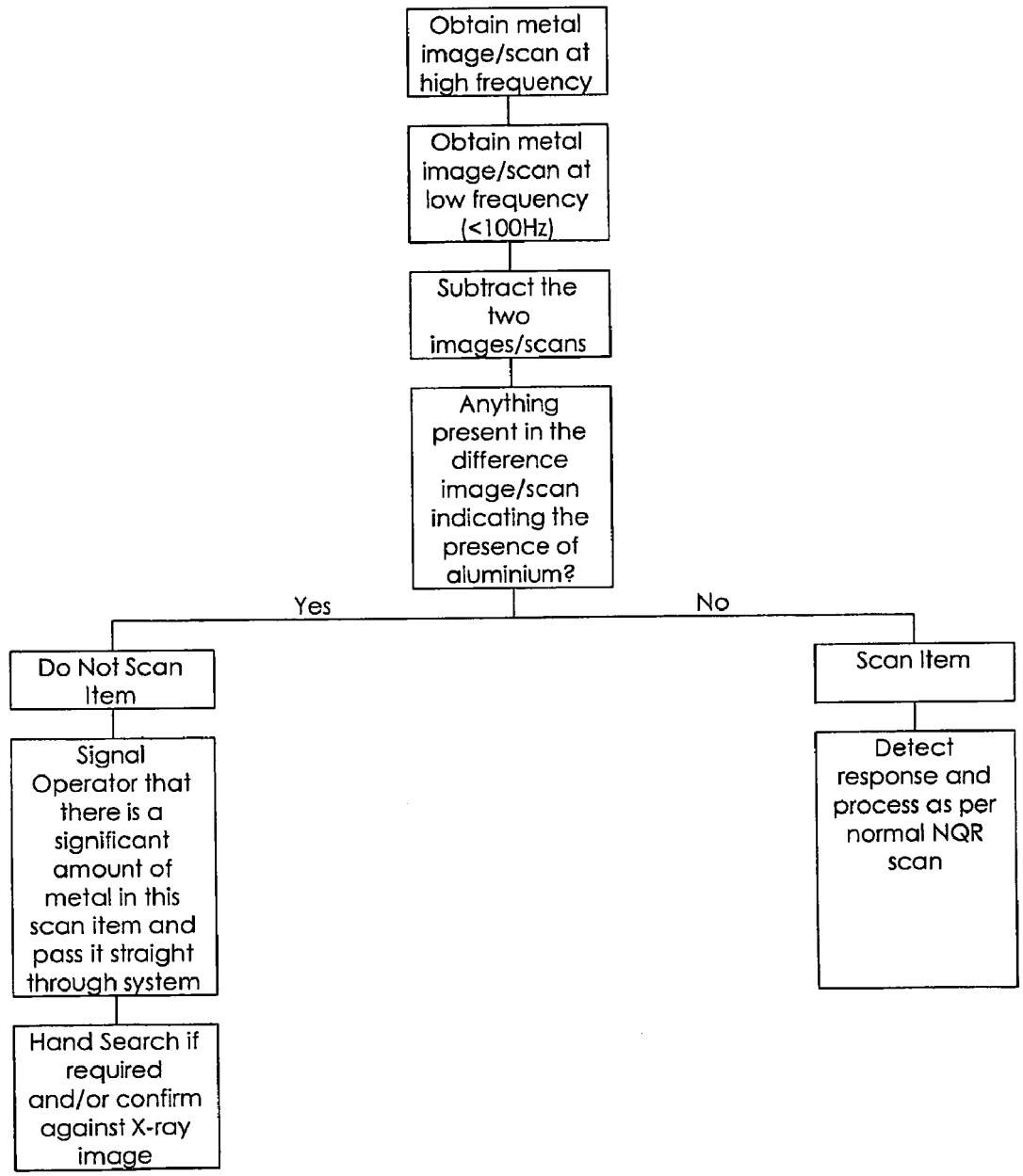
FIG. 12 is a flow chart showing the decision making process for detecting aluminium shielding of an object in accordance with an alternative arrangement of the sixth embodiment.

Aluminium foil can also be identified by performing the measurements of the NQR scanning device or metal detector at two very different frequencies. It has been discovered, pursuant to the present invention, that aluminium foil cannot be easily detected below 100 Hz due its thinness compared to the operating wavelength, however other metals can still be detected. Consequently, the present arrangement of the embodiment involves measuring the bag at one higher frequency and subtracting the response, whether it be a metal image or one dimensional scan, from a scan at a frequency near 100 Hz. Such a method should result in detection of aluminium shielded objects. FIG. 12 shows the decision making process for this embodiment.

In accordance with a seventh specific embodiment, as shown in FIG. 2, the apparatus includes sensing means in the form of one or more lines of optical or infrared scanners 22, 23 positioned along a scanning conveyor 25 such that the length and height of a scan item 24 can be determined prior to scanning by the NQR scanner device.

The sensors are positioned in straight vertical lines 23 to determine the height of the scan item 24 and straight horizontal lines 22 to determine the length of the scan item. If the scan item 24 exceeds the required height for the screening area 21 of the NQR scanner device, then it is bypassed around the scanning area 21 and not scanned. If the scan item's length is too long, then it is either bypassed around the scanning area 21 or it is scanned in two successive scans. The first scan covers approximately one half of the scan item and the second scan covers approximately the second half of the scan item. The results from the two scans are either analysed separately or added together to determine if an NQR substance is present or not.

Determination of the length of the item enables the item to be scanned to be placed near the centre of the coil where inductive losses can, for some but not all, items be at a minimum. Minimising the inductive losses can result in the Q and frequency shifts being minimised, which results in the best possible opportunity for detection of NQR signals because the Q is maintained at a high level.

The eighth embodiment of the best mode is substantially identical to the first embodiment, except that in the eighth embodiment, an external temperature probe or probes 13 are connected to the NQR scanner which sense the external building temperature. Signals representative of the external building temperature are in turn sent to the computer 12, which then instructs the transmitter unit 10 to send pulses to the coil 15 irradiating the scan item 14.

As in the first embodiment, if multiple probes are used then some mathematical combination is used to calculate the best temperature, such as the average. Temperatures are converted to frequencies via equations, such as equation 1, for each separate substance. The scan item is irradiated at a range of frequencies close to the frequency produced by conversion of the temperature to a frequency. Pulses at these frequencies excite quadrupole nuclei of the particular NQR substance being detected within the item, if present, creating a small RF magnetic field that induces a small voltage on the coil 15 which is measured by the receiver unit 11 and sent to the computer 12, resulting in a detection.

The external building temperature is measured in this embodiment because the NQR scanner may serve as an entry point to an important building such as a courthouse etc. Hence items brought into the building probably will reflect the external building temperature rather than the internal room temperature.

The ninth embodiment of the best mode is substantially identical to the first and eighth embodiments, except that in the present embodiment the temperature probe or probes 13 attached to the NQR scanner sense the external item temperature. Signals representative of the external item temperature are sent to the computer 12. The computer 12 then instructs the transmitter unit 10 to send pulses to the coil 15 irradiating the scan item 14 at a range of frequencies which lie close to the frequency calculated from the measured temperature. If multiple probes are used then some mathematical combination is used to calculate the best temperature, such as the average. Temperatures are converted to frequencies via equations, such as equation 1, for each separate substance. Pulses at these frequencies excite the NQR substance within the item creating a small RF magnetic field that induces a small voltage on the coil 15 which is measured by the receiver 11 and sent to the computer 12, resulting in a detection.

The external item temperature is measured in this embodiment because it may be found that the temperature of the scan item 14 is the most representative temperature of the substance being scanned.

The tenth embodiment of the best mode is substantially identical to the preceding embodiments, except that in the fourth embodiment, the temperature probe or probes 13 on the NQR scanner sense the internal item temperature. Signals representative of the internal item temperature are sent to the computer 12. The computer 12 instructs the transmitter 10 to send pulses to the coil 15 which irradiates the scan item 14 at a range of frequencies which lie close to the frequency calculated from the measured temperature. If multiple probes are used then some mathematical combination is used to calculate the best temperature, such as the average. Temperatures are converted to frequencies via equations, such as equation 1, for each separate substance. Pulses at these frequencies excite the NQR substance within the item creating a small RF magnetic field that induces a small voltage on the coil 15 which is measured by the receiver 11 and sent to the computer 12, resulting in a detection.

The internal bag temperature is measured in this embodiment because it may be found that the bag temperature is the most representative temperature of the substance being scanned. One method of determining the internal bag temperature is by using a microwave radiometer. Normal infrared wavelengths would be unable to penetrate through the outer layers of the bag, but microwaves having a longer wavelength can penetrate through the soft or hard plastic coverings of most suitcases, resulting in a method for measuring the internal item without opening the scan item.

The eleventh embodiment of the best mode is substantially identical to the preceding embodiments, except that in the present embodiment, temperature probe or probes 13 attached to the NQR scanner sense one or more of room temperature, external building temperature, external item temperature or internal item temperature. Signals representative of these results are sent to the computer 12 which then instructs the transmitter 10 to send pulses to the coil 15 which irradiates the scan item 14 at a range of frequencies which lie close to the frequency calculated from some combination of the measured temperature or temperatures. The temperature is converted to a frequency via equations such as equation 1 for each separate substance. Pulses at these frequencies excite the NQR substance within the item creating a small RF magnetic field that induces a small voltage on the coil 15 which is measured by the receiver 11 and sent to the computer 12, resulting in a detection.

In this embodiment it may be found that the best temperature to scan the bag is some mathematical combination of one or more of the temperatures being measured.

The twelfth embodiment of the best mode is substantially identical to the preceding embodiments, except that in the present embodiment a temperature sensor or sensors 13 attached to the NQR scanner creates a thermal image or images of the item to be scanned. Signals representative of this image or images are sent to the computer 12 which then instructs the transmitter 10 to send pulses to the coil 15 that irradiates the scan item 14 at a range of frequencies which lie close the frequency calculated from some combination of one or more of the pixellated temperatures measured.

Again temperatures are converted to frequencies via equations, such as equation 1, for each separate substance. Pulses at these frequencies excite the NQR substance within the item create a small RF magnetic field that induces a small voltage on the coil 15 which is measured by the receiver 11 and sent to the computer 12, resulting in a detection.

In this embodiment it may be found that the best temperature to scan the object is some mathematical combination of one or more of the pixellated temperatures measured. This embodiment also allows the computer to check that the scanned object is not excessively hot or excessively cold. If it is found to have a substantially different temperature to the other surroundings the item is flagged to be checked manually by the operator.

The thirteenth embodiment of the best mode is substantially identical to the preceding embodiment, except that in the present embodiment, a temperature sensor or sensors 13 and temperature probe or probes 13 are attached to the NQR scanner creating one or more thermal images and temperature probe measurements of the surroundings. Signals representative of these images and temperature probe measurements are sent to the computer 12 which then instructs the transmitter 10 to send pulses to the coil that irradiates the scan item 14 at a range of frequencies which lie close to the frequency that is calculated from some mathematical combination of one or more of the pixellated temperatures and temperature probe measurements.

As before, temperatures are converted to frequencies via equations such as equation 1 for each separate substance. Pulses at these frequencies excite the NQR substance within the item creating a small RF magnetic field that induces a small voltage on the coil 15 which is measured by the receiver 11 and sent to the computer 12, resulting in a detection.

In this embodiment it may be found that the best temperature to scan the item is some mathematical combination of one or more of the pixellated temperatures and the environmental surroundings. The embodiment also allows the computer to check that bag is not excessively hot or excessively cold. If found to have a substantially different temperature to the other surroundings the item is flagged to be checked manually by the operator.

The fourteenth embodiment of the best mode is substantially identical to the preceding embodiments, except that in the present embodiment, one or more temperature 'tags' 20 are attached to the item 14 to be scanned. The tags 20 are small units and either display the temperature of the item to which they are attached, or the 'tag' emits an RF signal which is received by an aerial attached to the computer 12 to inform it of the item's temperature.

Signals representative of the displayed temperature by way of the emitted RF signal are input into the computer 12, and the computer then instructs the transmitter to send pulses to the coil 15 that irradiates the scan item 14 at a range of frequencies which lie close to the frequency calculated from some mathematical combination of one or more of the temperatures indicated by the tag or tags.

As before, temperatures are converted to frequencies via equations such as equation 1 for each separate substance. Pulses at these frequencies excite the NQR substance within the item setting a small RF magnetic field that induces a small voltage on the coil 15 which is measured by the receiver 11 and sent to the computer 12, resulting in a detection.

In this embodiment it may be found that the best temperature to scan the bag is some mathematical combination of one or more of the temperatures indicated by the tags.

It should be appreciated that the scope of the invention is not limited to any particular one embodiment described herein, and that different combinations of features and modifications to the scanner device in order to accommodate the same that do not depart from the spirit of the invention fall within its scope.

The invention claimed is:

1. An apparatus for exciting and detecting NQR in a substance containing quadrupole nuclei responsive to the NQR phenomenon, comprising:

An irradiator to irradiate an item that may contain a substance with RF waves to excite NQR in quadrupole nuclei within the substance and to receive an NQR signal emitted in response thereto;

a transmitter to produce and transmit an RF pulse to the irradiator to create said RF waves;

a receiver to receive and treat a received signal from said irradiator for subsequent processing and detection of a said NQR signal therein;

a sensor to sense an extraneous parameter or parameters that may influence the detection of the NQR signal from the item to be irradiated prior to operation of the transmitter and to generate a sensor signal corresponding to the extraneous parameter or parameters sensed; and a processor to process the sensor signal to control the operation of the transmitter depending on the sensor signal prior to creating said RF waves, and to control the operation of the receiver, to facilitate the excitation and detection of an NQR signal, and to process the treated received signal to identify an NQR signal therein.

2. An apparatus as claimed in claim 1, wherein the extraneous parameter or parameters include temperature and the processor is adapted to control the transmitter and the irradiator to irradiate the item in a range of NQR frequencies that lie close to the NQR frequency of the substance containing quadrupole nuclei to be detected, as adjusted in accordance with the sensed temperature.

3. An apparatus as claimed in claim 2, wherein the sensor is a temperature probe for sensing the ambient room temperature.

4. An apparatus as claimed in claim 2, wherein the sensor is a temperature probe for sensing the external building temperature.

5. An apparatus as claimed in claim 2, wherein the sensor is a temperature probe for sensing the external temperature of the item.

6. An apparatus as claimed in claim 2, wherein the sensor is a temperature probe for sensing the internal temperature of the item.

7. An apparatus as claimed in claim 2, wherein the sensor is a temperature probe for sensing a combination of one or more of the ambient room temperature, the external building temperature, the external item temperature and the internal item temperature.

8. An apparatus as claimed in claim 2, wherein a thermal image of the item is used to determine its temperature and detect excessively hot or cold items.

9. An apparatus as claimed in claim 2, wherein the temperature sensed originates from a probe ('tag') attached to the item.

10. An apparatus as claimed in claim 1, further comprising an RF probe, wherein the RF probe is used to monitor any RF emissions from the item prior to irradiation of the item.

11. An apparatus as claimed in claim 1, wherein sensors are used to determine the height and length of the item prior to irradiation of the item.

12. An apparatus as claimed claim 1, wherein said sensor comprises a probe that is able to detect RF emissions from the item and send RF emission signals representative thereof to the processor, the processor being operable to monitor the RF emission signals and to provide an indication that the item is not suitable for NQR detection if the RF emissions from an item containing a sample exceed a prescribed threshold level.

13. An apparatus as claimed in claim 1, wherein said sensor comprises an RF antenna that is able to be excited with pulses of RF energy to irradiate the item and receive return signals after a period of dead time, the processor being operable to measure and transform the return signals into frequency space and, if the return signal detected at the transmit frequency exceeds a predetermined threshold, indicate the presence of a significant amount of metal.

14. An apparatus as claimed in claim 1, wherein said sensor comprises a plurality of RF antennas, one RF antenna being continuously excited with RF energy to irradiate an item to be irradiated and the other RF antenna(s) being disposed to receive a signal in respect of the excited RF energy and null it out, thereby keeping the RF antenna in induction balance in the absence of any disturbance, and sensing such disturbance as may be caused by a metallic object to detect same.

15. An apparatus as claimed in claim 1, wherein said sensor comprises one or more metal imagers for creating an image of any metal objects sensed within an item to be irradiated.

16. An apparatus as claimed in claim 15, wherein said metal imagers comprise a multiple of coils arranged in a linear 1D, planar 2D or box shaped 3D array.

17. An apparatus as claimed in claim 16, wherein said metal imagers generate a metallic image by using long wavelength RF (1–100 khz) signals.

18. An apparatus as claimed in claim 16, wherein said metal imagers generate a metallic image by using microwave energy (high MHz–GHz) signals.

19. An apparatus as claimed in claim 1, wherein said apparatus is interconnected with an X-ray machine, whereby the X-ray machine is used to detect metal objects in the item to be irradiated.

20. An apparatus as claimed in claim 19, wherein the X-ray machine provides 2D or 3D X-ray images to identify metal objects.

21. An apparatus as claimed in claim 18, interconnected with an X-ray machine, whereby the X-ray machine is used to detect metal objects in the item to be irradiated, wherein the X-ray image is combined with the microwave image to identify metallic objects not well identified by one or the other image.

22. An apparatus as claimed in claim 1, wherein the processor is adapted to monitor the resonant frequency and system Q as an item to be irradiated is moved into the irradiator, and process Q profiles to identify the existence of metallic objects within the item.

23. An apparatus as claimed in claim 1, wherein the processor is adapted to change the operating frequency of the irradiating RF energy to detect certain metallic objects that are not easily detectable at low frequencies, and comparing measurements at these different operating frequencies to ascertain the presence of said certain metallic objects.

24. A method of exciting and detecting NQR in a substance containing quadrupole nuclei responsive to the NQR phenomenon, the method comprising the steps of:
irradiating an item that may contain a substance with RF waves to excite NQR in quadrupole nuclei within the substance and receiving an NQR signal emitted in response thereto;
producing and transmitting an RF pulse to create said RF waves;
receiving and treating a received signal for subsequent processing and detection of a said NQR signal therein;
sensing an extraneous parameter or parameters that may influence the detection of the NQR signal from the item to be irradiated prior to the transmission and generating a sensor signal corresponding to the extraneous parameter or parameters sensed; and
processing the sensor signal to control the transmission of the RF pulse in dependence upon the sensor signal prior to creating said RF waves, and controlling the receiving and treating of the received signal, to facilitate the excitation and detection of an NQR signal, and processing the treated received signal to identify an NQR signal therein.

25. A method as claimed in claim 24, wherein the extraneous parameter or parameters include temperature and the irradiation of the item is in a range of NQR frequencies that lie close to the NQR frequency of the substance containing quadrupole nuclei to be detected, as adjusted in accordance with the sensed temperature.

26. A method as claimed in claim 25, wherein the temperature is the ambient room temperature.

27. A method as claimed in claim 25, wherein the temperature is the external building temperature.

28. A method as claimed in claim 25, wherein the temperature is the external temperature of the item.

29. A method as claimed in claim 25, wherein the temperature is the internal temperature of the item.

30. A method as claimed in claim 25, wherein the temperature is a combination of one or more of the ambient room temperature, the external building temperature, the external item temperature, and the internal item temperature.

31. A method as claimed in claim 25, wherein the method comprises the further step of using a thermal image of the item to determine its temperature and detect excessively hot or cold items.

32. A method as claimed in claim 25, wherein the temperature is sensed by a probe ('tag') attached to the item.

33. A method as claimed in claim 24, further comprising the step of monitoring any RF emissions from the item prior to irradiation of the item.

34. A method as claimed in claim 24, further comprising the step of determining the height and length of the item prior to irradiation of the item.

35. A method as claimed claim 24, further comprising the steps of: detecting RF emissions from the item; and monitoring the RF emissions to provide an indication that the item is not suitable for NQR detection if the RF emissions from an item containing a sample exceed a prescribed threshold level.

36. A method as claimed in claim 24, wherein the irradiation of the item is implemented by pulses of RF energy to irradiate the item and return signals are received after a period of dead time, the return signals being measured and transformed into frequency space, wherein the method comprises the further step of detecting if the return signal is at the transmit frequency and exceeds a predetermined threshold, thereby indicating the presence of a significant amount of metal.

37. A method as claimed in claim 24, wherein the irradiation of the item is implemented by continuous excitation with RF energy using an RF antenna, and the method comprises the further step of receiving a signal in respect of the excited RF energy and nulling it out, thereby keeping the RF antenna in induction balance in the absence of any disturbance, and sensing such disturbance as may be caused by a metallic object to detect same.

38. A method as claimed in claim 24, comprising the step of creating an image of any metal objects sensed within an item to be irradiated using one or more metal imagers.

39. A method as claimed in claim 38, wherein said metal images are generated using long wavelength RF (1–100 khz) signals.

40. A method as claimed in claim 38, wherein said metal images are generated using microwave energy (high MHz–GHz) signals.

41. A method as claimed in claim 24, wherein metal objects in the item to be irradiated are detected using X-rays.

42. A method as claimed in claim 41, wherein the X-rays are used to generate 2D or 3D X-ray images to identify metal objects.

43. A method as claimed in claim 41, wherein metal objects in the item to be irradiated are detected using X-rays in combination with a microwave image to identify metallic objects not well identified by one or the other image.

44. A method as claimed in claim 24, wherein the method comprises the further steps of monitoring the resonant frequency and system Q of the item and processing Q profiles to identify the existence of metallic objects within the item.

45. A method as claimed in claim 24, wherein the method comprises the further steps of changing the operating frequency of the irradiating RF energy to detect certain metallic objects that are not easily detectable at low frequencies, and comparing measurements at these different operating frequencies to ascertain the presence of said certain metallic objects.

46. An apparatus for exciting and detecting NQR in a substance containing quadrupole nuclei responsive to the NQR phenomenon, comprising:

means for irradiating an item that may contain a substance with RF waves to excite NQR in quadrupole nuclei within the substance and to receive an NQR signal emitted in response thereto;

means for producing and transmitting an RF pulse to the irradiating means to create said RF waves;

means for receiving and treating a received signal from said irradiating means for subsequent processing and detection of a said NQR signal therein;

means for sensing an extraneous parameter or parameters that may influence the detection of the NQR signal from the item to be irradiated prior to operation of the transmitting means and to generate a sensor signal corresponding to the extraneous parameter or parameters sensed; and means for processing the sensor signal to control the operation of the transmitting means depending on the sensor signal prior to creating said RF waves, and to control the operation of the receiving means, to facilitate the excitation and detection of an NQR signal, and to process the treated received signal to identify an NQR signal therein.

* * * * *